United States Patent
Kiml

[11] Patent Number: 5,717,348
[45] Date of Patent: Feb. 10, 1998

[54] SELF ADJUSTING EDGE DETECTOR CIRCUIT

[75] Inventor: Helmut Kiml, Tiefenbach, Germany

[73] Assignee: Texas Instruments Deutschland GmbH, Germany

[21] Appl. No.: 483,779

[22] Filed: Jun. 7, 1995

[30] Foreign Application Priority Data

Dec. 21, 1994 [EP] European Pat. Off. ............. 94120271

[51] Int. Cl.$^6$ ........................................... H03K 5/22
[52] U.S. Cl. ........................ 327/24; 327/79; 327/481
[58] Field of Search ............................ 327/23, 24, 13, 327/14, 15, 79–81, 481

[56] References Cited

U.S. PATENT DOCUMENTS

| | | | |
|---|---|---|---|
| 3,588,541 | 6/1971 | Chan et al. | 327/481 |
| 4,429,234 | 1/1984 | Streit | 327/481 |
| 5,262,682 | 11/1993 | Mitsuya et al. | 327/481 |

OTHER PUBLICATIONS

Patent Abstracts of Japan, vol. 12, No. 9 (E-572) (2856), Jan. 12, 1988. (Japanese Laid Open Patent Appln. Pub. 62-169,514 published Jul. 25, 1987).

*Primary Examiner*—Timothy P. Callahan
*Assistant Examiner*—Kenneth B. Wells
*Attorney, Agent, or Firm*—David S. Guttman; Richard L. Donaldson

[57] ABSTRACT

A edge detector for the production of output signal in a manner dependent on positive and negative edges of a square wave signal comprises a differential amplifier with two base-coupled transistors (Q1, Q2). Each emitter of such transistors is connected via a constant current source (S1 and, respectively, S2) with a supply voltage line (10) and the emitter currents of the transistors are split up between two collectors, of which the first ones are connected with one another and, via a third constant current source (S3), with ground (12). Two output loops each comprise a series circuit composed of a resistor (R3, R4) and the collector-emitter path of an output transistor (Q3, Q4) between ground (12) and the supply voltage line (10). In the case of each of such output transistors (Q3, Q4) the base is connected in each case with a second collector of the base-coupled transistor (Q1, Q2) so that the switching state of the output transistors (Q1, Q2) is set by the voltage at each second collector. The output signals are able to be tapped at the collector of such output transistors (Q3, Q4). An input terminal (14) is connected with the emitter of one (Q1) of the base-coupled transistors (Q1, Q2) for the supply of a current dependent on the input signal and one capacitor (C1) is connected with the emitter of the other one (Q2) of the base-coupled transistors (Q1, Q2).

2 Claims, 1 Drawing Sheet

_5,717,348_

SELF ADJUSTING EDGE DETECTOR CIRCUIT

BACKGROUND OF THE INVENTION

The invention relates to a edge detector for the production of output signals in a manner dependent on positive and negative edges of a square wave input signal.

The transmission of data signals via buses is now being employed on an ever increasing scale. In a bus system a plurality of electronic devices are connected with the bus, which can receive data signals from the bus or transfer signals to the bus. In order for the communication between the individual devices to take place without error, it is important for the devices to reliably respectively recognize the start and the end of a data signal, which is generally a square wave signal. For this purpose an edge detector may be utilized, which always provides a signal when there is a signal edge, i.e. either an ascending or a descending signal edge on the bus. The signal edge detector could for example be designed in the form of a comparator, which compares the signal level on the bus conductor with a fixed reference signal and always yields a edge recognition signal, when the signal level on the bus is below or above the reference signal level.

In a bus system it is however possible for pick-up to lead to a shift in the ground level, which may proceed to such an extent that the recognition of a signal edge is no longer possible by a simple comparison with a reference signal. The ground level may in fact in some circumstances be shifted so far that it assumes a position near the reference signal level, reliable recognition of the edge then no longer being possible.

One object of the invention is to create a edge detector which without any great circuit complexity renders possible reliable recognition of the edges of signal, which are transmitted by a bus.

In accordance with the invention this object is to be fulfilled by the features recited in the characterizing part of the claim.

SUMMARY OF THE INVENTION

In the edge detector in accordance with the invention for the recognition of signal edges of the applied input signal no separate reference level is required, and in each case the input signal level is compared with a level intermediately stored in the edge detector, which is equal to the level, which was present at the input prior to the occurrence of the respective edge to be recognized. There is accordingly a constant, automatic adaptation to the signal level respectively present at the input so that even if there is a shift in the ground potential of the edge detector circuit satisfactory recognition of the signal edges will still be possible.

One working embodiment of the invention will now be described with reference to the drawing.

DESCRIPTION OF THE EMBODIMENTS

Figure 1:
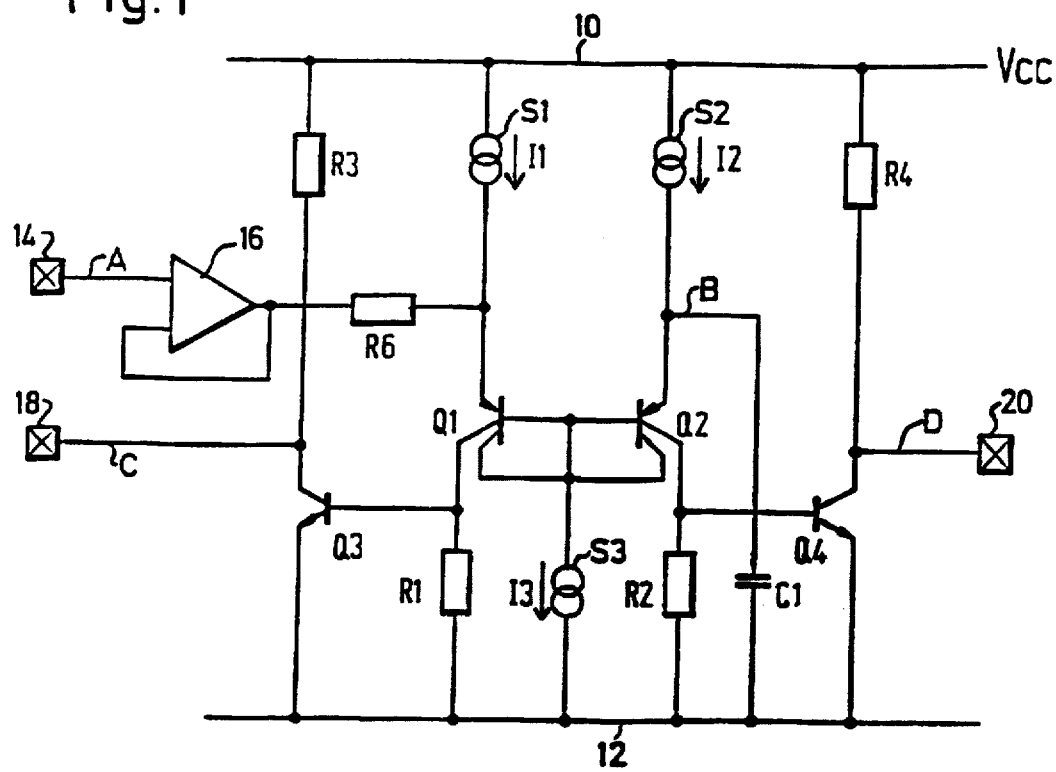
FIG. 1 is a circuit diagram of the edge detector in accordance with the invention.

The edge detector depicted in FIG. 1 comprises a differential amplifier having two base coupled transistors Q1 and Q2, whose emitters are connected via constant current source S1 and, respectively, S2 with a power supply line 10, which carries a positive supply voltage Vcc. The current sources S1 and S2 respectively supply direct current I1 and I2.

The base terminals of the two transistors Q1 and Q2 are connected with one another and, via a third current source S3, with a ground line 12. As will be seen, the transistors Q1 and Q2 each possess two collector terminals, of which the first ones are connected via a resistor R1 and, respectively, R2 with the ground line 12, whereas the others are connected with the base terminals and, via the power source S3, with the ground line 12.

The emitter currents of the transistors Q1 and Q2 are applied in each case in equal amounts, i.e. as halves, to the two collectors so that respectively one half of the emitter current flows through the resistors R1 and, respectively, R2 and the other half flows through the power source S3. Then we have: I3=I1/2+I2/2. Since the currents I1 and I2 are equal, this will mean that I3 is equal to I1=I2.

The input signal, whose edges are to be recognized, is supplied to the one input 14, from which it passes via an operational amplifier 16 acting as an impedance converter and a resistor R6 to the emitter of the transistor Q1.

Between the emitter of the transistor Q2 and the ground line 12 there is a capacitor C1, which serves as a storage capacitor, as will be seen later.

The edge detector of FIG. 1 possesses two outputs 18 and 20, at which respectively there are supplied, in the one case, an output signal indicating the positive edge of the input signal and an output signal indicating the negative edge of the input signal. The output signal at the output 18 is produced by an NPN transistor Q3, whose base is connected with the second collector of the transistor Q1. The emitter of this transistor Q3 is connected with the ground line 12. The collector is connected with the output 18, and via resistor R3 it is connected with the power supply line 10.

The output signal at the output 20 is produced by an NPN transistor Q2, whose base is connected with the second collector of the transistor Q2. The emitter of this transistor Q4 is connected with the ground line 12 and its collector is connected with the output 20 and, via a resistor R4, with the power supply line 10.

Figure 2:
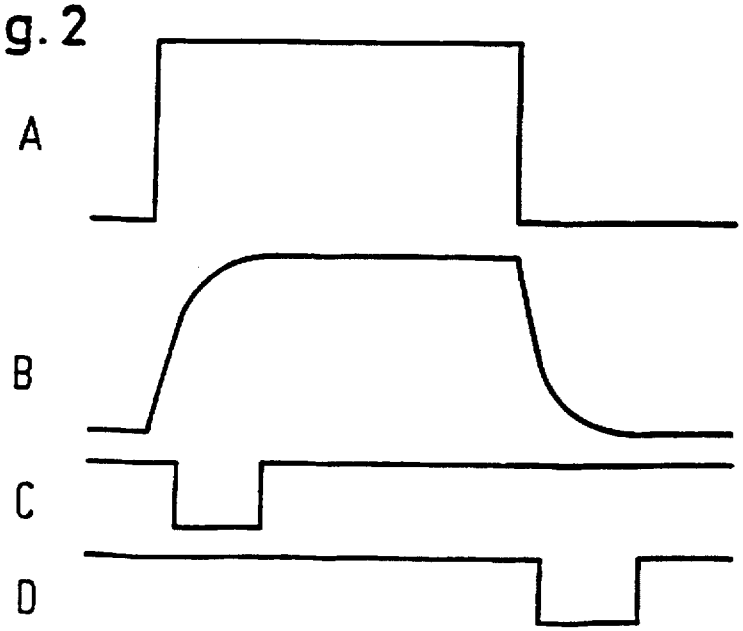
FIG. 2 are plots of signals at different points in the circuit of FIG. 1.

The edge detector of FIG. 1 operates in the following manner:

Let it be assumed that the input 14 is connected with a bus serving for the transmission of data signals and that the bus is just at this time in the idle state, that is to say it is not carrying any data signals. This means that there will be an idle voltage along the bus, which is between the ground level and the positive supply voltage Vcc. In this neutral state there will be the same voltage at the emitter of the transistor Q1 as at the input 14, and owing to the differential amplifier behavior of the two transistors Q1 and Q2 such input voltage will also become established at the emitter of the transistor Q2. The current flowing through the two collectors of the transistors Q1 and Q2 will be respectively half the value of the current I1 and, respectively, I2 so that accordingly the currents I1/2 and, respectively, I2/2 will also flow through the resistors R1 and R2. These currents will produce voltage drops across the resistors R1 and R2, which are smaller than the base-emitter voltage of the transistors Q3 and Q4 so that such transistors are in the turned off state, this meaning that at the outputs 18 and 20 the voltage Vcc will respectively occur the which corresponds to the signal value "H". If now, as shown in FIG. 2 at A, adjacent to input 14 the positive edge of a data signal occurs, there will, at the resistor R6, the voltage drop, which means that the emitter of the transistor Q1 receives an additional emitter current. Accordingly the sum of current from the current source S1 and the current from the input 14 will flow to the emitter of this transistor Q1. This increased current will be split up between the two collectors of the transistor Q1 so that an increased current will also flow through the resistor R1. If the data signal is sufficiently large, that is to say is above a sufficient level, the current caused by the voltage drop at the resistor R6 and flowing through the resistor R1 will be sufficient to turn on the transistor Q3 owing to the voltage drop occurring at this resistor. This will occur, if the voltage drop at the resistor R1 is larger than the base-emitter voltage of the transistor Q1. If the transistor Q1 is turned on, the signal at the output 18 will change to a low value, which corresponds to the signal value "L". This will mean that the circuit described will only react to a data signal at the input 14, when such signal exceeds a certain threshold value.

The increased emitter current of the transistor Q1 will also mean that a larger current will flow through the collector connected with the current source S3. Since the current source S3 can however only conduct away a current which is equal to the current I1, this will mean that this current must be reduced, which flows through the collector, connected with the current source S3, of the transistor Q2. The same reduction in the current will occur as well in the second collector of the transistor Q2 so that the transistor Q4 will continue to be in the turned off state. Since the current source S2 will still, as previously, supply the current I2, the excess current, which can not be drained away by the current source S2, must flow into the capacitor C1 and charge same. This charging can however only be continued until at the emitter of the transistor Q2 the same voltage has been reached as at the emitter of the transistor Q1. As soon as this is the case it will no longer be possible for different currents to flow in the transistors Q1 and Q2 so that as regards the currents there will be the same condition as there was prior to the occurrence of the input signal. This means that exactly half of each of the currents I1 and, respectively, I2 will flow through the resistor R1 and the resistor R2. The transistor Q3 will therefore return to the turned off condition, since the voltage drop at the resistor R1 is no longer sufficient to turn it on. This will be gathered from FIG. 2 at C. The duration of the pulse occurring at the output 18, and which is the signal indicating the occurrence of the positive edge of the input signal, is determined by the time constant set by the resistor R6 and the capacitor C1.

It will be seen from FIG. 2 that the voltage at the point B increases in accordance with the time constant set by the resistor R6 and the capacitor C1, if at the input 14 an input signal with the shape indicated in FIG. 2 at A occurs. It will furthermore be seen that the output signal at the output 18 only exists during a period, in which the voltage at the point B changes, i.e. the charging of the capacitor C1 is not yet completed. The output signal at the output 18 hence terminates when capacitor C1 is charged, that is to say the voltage at the point B has assumed the value of the input voltage at the input 14 and has accordingly assumed the value of the voltage at the emitter of the transistor Q1.

On the occurrence of the negative edge of the input signal at the input 14 the emitter current of the transistor Q1 will be reduced via the resistor R6, this leading to a reduction in the current flowing through the collector connected with the current source S3. Since the current through the current source S3 is however held constant, it is necessary for the additional current to be supplied via the emitter of the transistor Q2. Since the current source S2 can only supply the constant current I2, the additional emitter current of the transistor Q2 is produced by the discharge of the capacitor C1. In FIG. 2 such discharge is indicated at B, which begins after the occurrence of the negative signal edge at the input 14. The increased emitter current of the transistor Q2 also leads to an increase in the current through the resistor R2, which leads to a greater voltage drop at the resistor R2. Accordingly the transistor Q4 is turned on so that at the output 20 there will be a transition to a low voltage value, which corresponds to the signal value "L". This is indicated in FIG. 2 at D.

As soon as the discharge of the capacitor C1 is terminated, the same voltage will become established at the emitter of the transistor Q2 as at the emitter of the transistor Q1 and the flow of different emitter currents in such transistors will cease. Accordingly the current I2/2 will again flow through the resistor R2, which is insufficient to cause a voltage drop at the resistor R2, which is larger than the base-emitter voltage of the transistor Q4. This transistor Q4 is therefore turned off again so that the voltage at the output 20 again assumes the supply voltage value Vcc, which corresponds to the signal value"H". This is to be seen in FIG. 2 at D.

The above described circuit can accordingly recognize signal edges occurring at the input 14 with great reliability without a fixed reference level being required. The edge detector in fact recognizes or detects the signal edge as a departure from the voltage value, present prior to the occurrence of the edge, which value is stored respectively in the capacitor C1. Such edge recognition will even operate satisfactorily, if the ground potential has been shifted owing to pick-up of interfering or owing to other effects, toward higher voltage values.

I claim:

1. A self-adjusting edge detector circuit for a two-level input signal, comprising:

positive and ground lines respectively for a positive constant voltage Vcc and a ground;

a differential amplifier having first and second PNP transistors (Q1, Q2)

each having its emitter coupled to the positive line by a respective current source S1, S2 which supplies a constant current I to its corresponding emitter;

each having its collector evenly split into a first collector coupled to ground via a respective collector resistor R1, R2 and a second collector coupled to ground via a common current source S3 which drains a constant current I to ground;

each having its base coupled to its second collector;

an input terminal for the two-level input signal, coupled by an input resistor to the first transistor's emitter;

a capacitor coupled between the second transistor's emitter and the ground line;

first and second NPN output transistors Q3, Q4 whose (i) emitters are coupled to the ground line, (ii) bases are respectively coupled to the first collectors of the first and second transistors, and (iii) collectors are coupled to the positive line via respective first and second output resistors R3, R4; and positive-edge and negative-edge output terminals respectively coupled to the first and second output transistors' collectors;

the collector resistors R1, R2 being of equal value selected so that the voltage drop across R1 or R2 only exceeds the base-emitter threshold voltage of its corresponding output transistor Q3 or Q4 when the first and second transistors' emitter voltages differ by more than a predetermined threshold voltage.

2. The circuit of claim 1 further comprising an operational amplifier 16 coupling the input terminal to the input resistor.

* * * * *